(12) United States Patent
Lauterbach et al.

(10) Patent No.: US 6,313,517 B1
(45) Date of Patent: Nov. 6, 2001

(54) VERTICALLY INTEGRATED SEMICONDUCTOR COMPONENT

(75) Inventors: Christl Lauterbach, Höhenkirchen-Siegertsbrunn; Werner Weber, München, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/663,462

(22) Filed: Sep. 15, 2000

Related U.S. Application Data

(62) Division of application No. 09/077,074, filed on May 19, 1998.
(60) Provisional application No. PCT/DE96/02108, filed on Nov. 6, 1996, now Pat. No. 6,146,992.

(30) Foreign Application Priority Data

Nov. 22, 1995 (DE) .............................................. 195 43 540

(51) Int. Cl.[7] ............................ H01L 29/40; H01L 23/48; H01L 23/58
(52) U.S. Cl. .......................... 257/621; 257/753; 257/633
(58) Field of Search .............................. 257/67, 621, 633, 257/753

(56) References Cited

U.S. PATENT DOCUMENTS

| 4,675,370 | | 6/1987 | Tan et al. . |
| 4,939,568 | | 7/1990 | Kato et al. . |
| 5,354,929 | | 10/1994 | Kirchhoff et al. . |
| 5,416,233 | | 5/1995 | DeVries et al. . |
| 5,627,106 | * | 5/1997 | Hsu ........................................ 438/459 |
| 5,712,506 | * | 1/1998 | Shimoto et al. ...................... 257/633 |
| 5,745,984 | * | 5/1998 | Cole, Jr. et al. ........................ 29/834 |

FOREIGN PATENT DOCUMENTS

| 43 14 907 C1 | 5/1993 | (DE) . |
| 44 00 985 C1 | 1/1994 | (DE) . |
| 44 33 833 | 3/1996 | (DE) . |
| 44 33 845 | 3/1996 | (DE) . |
| 0 206 696 | 12/1986 | (EP) . |
| 0 635 885 A1 | 7/1993 | (EP) . |
| 0 610 709 A1 | 1/1994 | (EP) . |

* cited by examiner

Primary Examiner—Tom Thomas
Assistant Examiner—Ori Nadav
(74) Attorney, Agent, or Firm—Schiff Hardin & Waite

(57) ABSTRACT

A vertically integrated semiconductor component is provided with component levels disposed on different substrates. The substrates are joined by a connecting layer of benzocyclobutene and an electrical connection is provided between component levels by a vertical contact structure. A low-stress gluing is provided by the benzocyclobutene connecting layer.

5 Claims, 3 Drawing Sheets

VERTICALLY INTEGRATED SEMICONDUCTOR COMPONENT

CROSS-REFERENCE TO RELATED APPLICATION

The present application is a division of application Ser. No. 09/077,074, now U.S. Pat. No. 6,146,992, filed May 19, 1998, which was the National Stage of International Application No. PCT/DE96/02108, filed Nov. 6, 1996.

The present invention is directed to a method for manufacturing semiconductor components having a specific contact structuring that is provided for a vertical, electrically conductive connection of a plurality of semiconductor components.

BACKGROUND OF THE INVENTION

Semiconductor circuits are currently manufactured in planar technology. The complexity that can be achieved on a chip is limited by the size thereof and by the structural fineness that can be achieved. In conventional technology, the performance of a system composed of a plurality of semiconductor chips connected to one another is significantly limited by the limited number of possible connections between individual chips via terminal contacts, by the low speed of the signal transmission via such connections between various chips, the limited speed in complex chips due to highly branched interconnects and the high power consumption of the interface circuits.

These indicated limitations given the employment of planar technology can be overcome with three-dimensional techniques of the circuitry. The arrangement of a plurality of components above one another allows a parallel communication of these components with little outlay for electrically conductive connections in a level. Moreover, speed-limiting interchip connections are avoided.

A known method for the manufacture of three-dimensional ICs is based on depositing a further semiconductor layer over a level of components and recrystallizing this further semiconductor layer via a suitable method (for example, local heating by laser) and realizing a further component level therein. This technique also exhibits significant limitations that are established by the thermal load on the lower level in the recrystallization and the obtainable yield limited by defects.

In an alternative method, the individual component levels are manufactured separately from one another. These levels are thinned to a few $\mu$m and connected to one another by wafer bonding. The electrical connections are produced in such a way that the individual component levels have their front side and back side provided with contacts for the interchip connection.

U.S. Pat. No. 4,939,568 discloses a vertically integrated semiconductor component and an appertaining manufacturing method, whereby the vertical, conductive connection ensues via vertical metal pins that are located in the substrate of a respective layer level. The manufacturing method provides that the back side of the substrate, which is not provided with a layer structure, be ground down until these vertical conductive connections are uncovered. This side of the substrate can then also be provided with structures. For a direct connection to a following level of the component, the uncovered surfaces of the vertical conductive connections are provided with aluminum contacts.

DE 43 14 907 C1 discloses a manufacturing method for vertically integrated components wherein the component levels are first generated on separate substrates. The two substrates are connected to one another after the application of a planarization layer on the lower substrate and the thinning of the upper substrate. Integrated, pin-shaped metal structures are provided in the substrate for the electrically conductive connection between component levels.

DE 44 00 985 C1 discloses that polyimide be employed for the planarization level, that via holes be generated first for the connection of the component levels and that these be subsequently filled with a contact material. The polyimide layer is disadvantageous in this embodiment, this layer splitting water off during hardening (or, respectively, imidization) and exhibiting a reaction contraction. Water that is split off remains largely in the component and leads to additional stresses that can degrade the finished component in terms of its function or durability. Further, a polyimide layer has only a slight planarization effect of, for example, 30%, so that a plurality of layers are required that in turn exhibit adhesion problems relative to one another.

SUMMARY OF THE INVENTION

A problem of the present invention is to specify an improved structure and a simple manufacturing method for a vertically integrated component and, in particular, to find a suitable material for the intermediate layer that assures a reliable and stress-free connection between the component levels and that withstands further manufacturing steps required for the vertically integrated component without damage.

This object is achieved with a semiconductor component according to the present invention which provides a semiconductor component that comprises a first substrate having an upper surface that is connected to a first component comprising a first contact region that is electrically conductive. The semiconductor component of the present invention also comprises a second substrate also with an upper surface that is connected to a second component that comprises a second contact region that is also electrically conductive. The second substrate further comprises a lower surface and a via hole extending from the upper surface of the second substrate to the lower surface of the second substrate. A connecting layer is sandwiched between the lower surface of the second substrate and the upper surface of the first substrate and a vertical contact structure extends from the second contact region, through the via hole to the first contact region thereby electrically connecting the first contact region to the second contact region thereby electrically connecting the first contact region to the second contact region. The connecting layer comprises a homo-polymerized benzocyclobutene. Manufacturing methods and further advantageous developments of the invention are also disclosed.

The inventive semiconductor component comprises at least two component levels that are respectively realized in their own substrate. In the inventive semiconductor component, the component levels realized in separate substrates are glued by a connecting layer that comprises a homo-polymerized benzocyclobutene (BCB). The electrical connection between the component levels or, respectively, the components realized in the substrates is realized by a vertical contact structure that electrically conductively connects a first contact region on the first substrate to a second contact region on the second substrate.

The invention is the first to propose a structure that enables a stress-free connection of the two substrates. Since the second (upper) substrate is thinned to an optimally low layer thickness of a few $\mu$m before the connecting, this is especially sensitive to thermo-mechanical stresses.

Since only a slight reaction contraction (of, for example, less than 5 percent) occurs when hardening the connecting layer realized with BCB, practically no additional stresses at the boundary surface between connecting layer and second substrate are observed in the inventive semiconductor component.

The connecting layer exhibits a very good adhesion to semiconductors, oxides and metals that usually form the surfaces of semiconductor components. The connecting layer of BCB hardens without splitting off volatile products and exhibits no gas evolution. This is particularly significant given a relatively large-area gluing as in the inventive semiconductor component since such evolution of gasses leads to undesired inclusions of gasses that could in turn lead to additional stresses.

BCB layers are hydrophobic and exhibit no water absorption. They are thermally stable up to approximately 400° C. and therefore withstand standard environmental conditions during further manufacturing steps and during operation of the finished semiconductor component. Added thereto is that BCB layers have a very good planarizing effect. A degree of planarization (DOP) of more than 90 percent can already be achieved with one planarization layer. As a further advantageous property, the inventive connecting layer exhibits an extremely low dielectric constant e of 2.5 (at 1 MHz). As a result thereof, capacitative couplings between the two component levels or, respectively, between the circuits and components integrated in the first and in the second substrate are reduced. The glass transition temperature of the connecting layer of BCB is adequately high and lies, for example, at 350° C. in one exemplary embodiment. Even at high operating temperatures of the semiconductor component, thus, no phase transitions that could lead to increased thermal stress are anticipated. The high breakdown voltage of the connecting layer of up to $3 \times 10^6$ volts/cm must also be emphasized, this seeing to a good electrical insulation of the individual component levels.

Benzocyclobutenes exhibit a thermal rearrangement into chino-dimethanes:

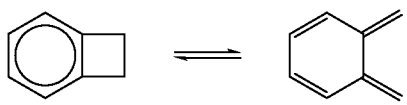

The chino-dimethanes in turn enter into a cyclo-addition with themselves or with other unsaturated compounds upon formation of a six-membered ring:

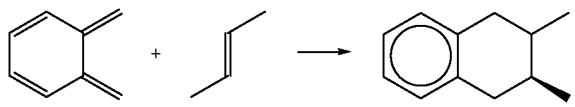

Bisbenzocyclobutenes having the general structural formula

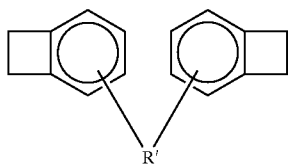

are suitable for the formation of a crosslinked polymer, whereby R' is a bivalent organic or inorganic radical that contains at least one C—C bond, preferably in conjunction with the aromatic. A preferred bisbenzocyclobutene has a divinyltetramethyldisiloxane group as radical R and is commercially available under the tradename Cyclotene® 3022 (Dow).

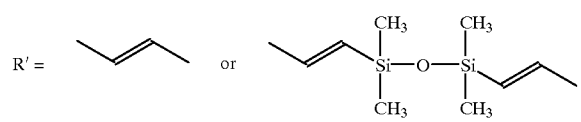

This specific BCB was developed as dielectric polymer for electronic applications. Employments in multi-chip modules as dielectric and intermediate layers have already been disclosed. It has thereby proven an advantage that further semiconductor, oxide, nitride and metal layers that exhibit good adhesion to BCB can be unproblematically deposited on hardened (polymerized) BCB layers.

The invention shows that BCB can also be utilized as connecting layer in vertically integrated semiconductor components, whereby the BCB fulfills an adhesive function. Since one of the substrates is thinned to a thickness of only a few μm and therefore behaves like a film that can sensitively react to warping and to other stresses with a change of its component properties, high demands are made of the intermediate layer or, respectively, of the glued connection. The BCB layers meets all of these demands, is simple to utilize and leads to a fully functional, vertically integrated semiconductor component.

At least two substrates, which can be composed of the same or of different materials, are integrated in the inventive semiconductor component. It is also possible to generate different types of components on the two substrates, so that different manufacturing processes that would not be compatible on a single substrate can also be employed. For example, it is possible to combine bipolar and CMOS circuits in silicon substrates with corresponding, similar or different circuits on, for example, III/V compound semiconductor substrates. Fast circuits in III–V technology can thus be combined, for example, with highly integrated memories. In a corresponding way, it is also possible to unite different applications in a vertically integrated semiconductor component, for example optoelectronic and light-processing components on, for example, InGaAsO/InP or GaAS/GaAIAs basis with the corresponding driver or amplifier circuits in silicon.

Other objects and advantages of the present invention will become apparent from reading the following detailed description and appended claims, and upon reference to the accompanying drawings.

BRIEF DESCRIPTION OF THE DRAWINGS

An inventive method for manufacturing the new vertically integrated semiconductor component is explained in greater detail below on the basis of exemplary embodiments and the following drawing, wherein:

FIGS. 2–4 illustrate a second substrate with component or, respectively, circuit integrated therein in a schematic crossection, whereas

It should be understood that the drawings are not necessarily to scale and that the embodiments are sometimes illustrated by graphic symbols, phantom lines, diagrammatic representations and fragmentary views. In certain instances, details which are not necessary for an understanding of the present invention of which render other details difficult to perceive may have been omitted. It should be understood that the invention is not necessarily limited to the particular embodiments illustrated herein.

DETAILED DESCRIPTION OF THE PRESENTLY PREFERRED EMBODIMENTS

Figure 1:
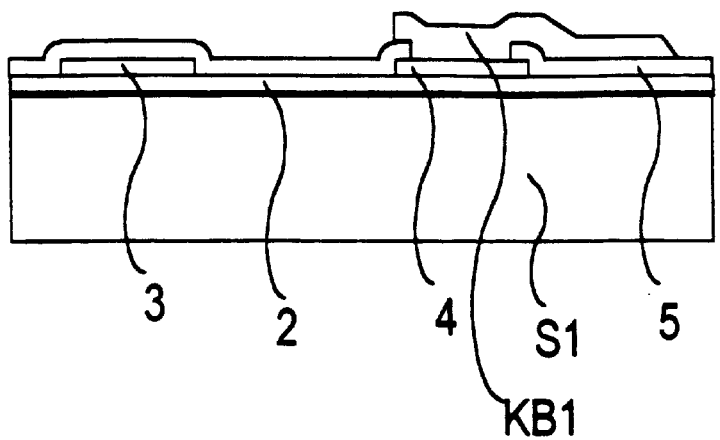
FIG. 1 is a schematic crossection of a first substrate with portions of a circuit or, respectively, of a component integrated therein.

FIG. 1 shows a first substrate S1 in which a semiconductor circuit is realized. For the sake of clarity, only two metallizations 3 and 4 of the component are shown, these being arranged above an insulating layer 2. Whereas the metallization 3 is covered by a passivation layer 5, the metallization 4 is provided for the contacting with a further component level, i.e. with a second substrate S2. For better connection of the metallization 4, a first contact region KB1 that is in electrically conductive communication with the metallization 4 is provided over this metallization 4. The first contacting region KB1 is fabricated of an arbitrary electrically conductive material and, in a specific embodiment of the invention, is composed of a metal alloy with a low melting point, for example AuIn, AgSn or SnPb.

Figure 2:
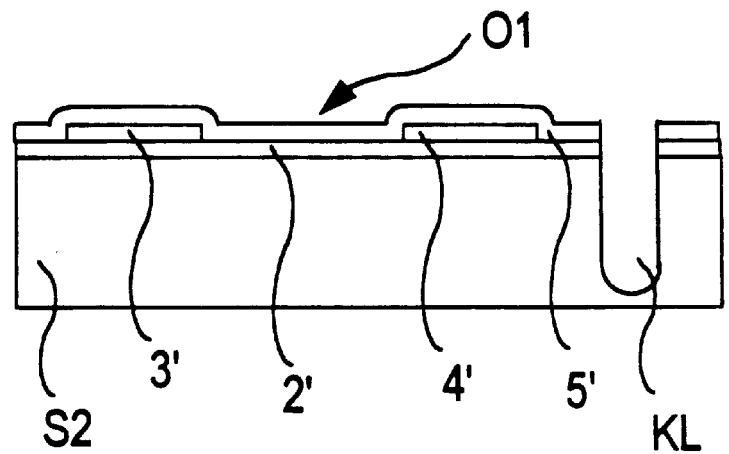
Figure 3:
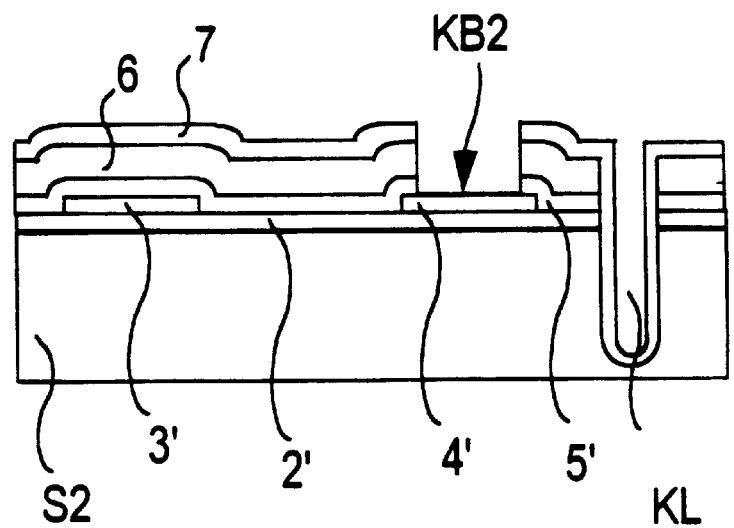

FIG. 2 shows a second substrate 2' composed, for example, of silicon in which an electrical component or a semiconductor circuit is realized. Here, too, only one metallization level via which function regions of the component or of the circuit are electrically driven is shown for the sake of greater clarity. The metallizations 3' and 4' of the metallization level are shown over an insulation layer 2' in the Figure. The metallization level composed of the metallizations 3' and 4' is covered with a passivation layer 5'. The region provided for the via hole KL is defined with the assistance of an etching mask 6 that, for example, is realized via a photoresist technique in a silicon nitride layer. Via an anisotropic dry etching process, the via hole itself is generated to a depth of, for example, 5 to 7 $\mu$m. A further passivation 7, for example an oxide that also covers the insides of the via hole, is deposited thereover surface-wide. With an etching mask (not shown) that can likewise be opened with a photoresist technique, the surface of the metallization 4' that represents the second contact region KB2 provided for the vertical contacting with the first component level is uncovered.

Figure 4:
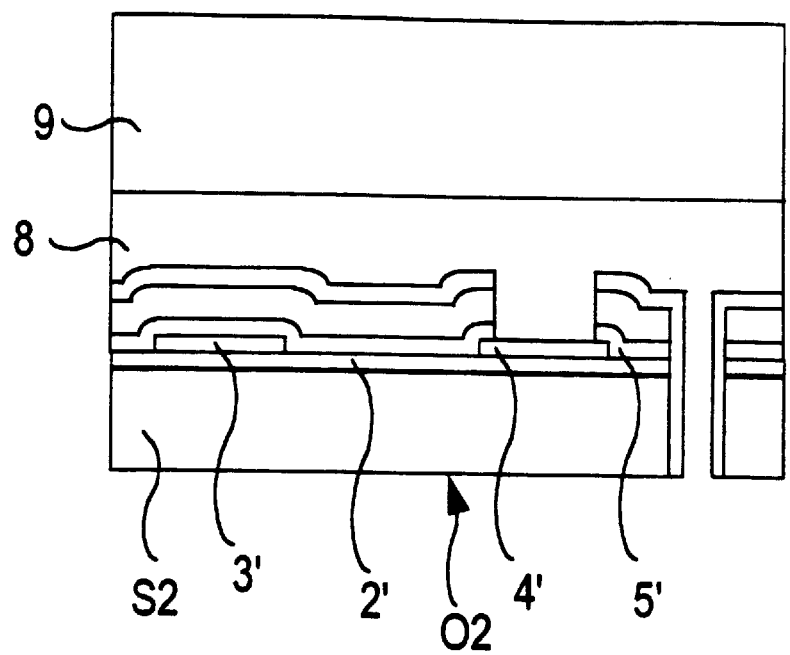

Before the joining of the two substrates S1 and S2, the back side of the second substrate S2 (=second surface O2) is eroded or, respectively, thinned until a residual layer thickness that guarantees the functionability of the components or, respectively, of the circuits in the substrate S2 remains. The erosion of the back substrate side can ensue, for example, by back-polishing (for example, CMP, Chemical Mechanical Polishing) or re-etching. The depth of the via hole KL is thereby selected such that the floor of the via hole is also removed when thinning the substrate S2, so that an opening extending through the entire substrate S2 arises. The manipulation of the thinned substrate S2 is facilitated when a further substrate 9 as auxiliary substrate is secured on the front side (first surface) of the substrate S2 over the component structures before the thinning, being secured, for example, with an adhesive layer 8. This adhesive layer can be composed, for example, of polyimide, polyacrylate or epoxy. It is applied in a thickness of, for example, 1.5 $\mu$m and connects the auxiliary substrate 9 to the second substrate. This gluing can ensue especially advantageously on a BCB layer with which the substrate S2 was previously planarized. FIG. 4 shows the arrangement after the partial erosion of the second surface O2, whereby an opening to the via hole KL has arisen.

In the next step, the second substrate S2 connected to the auxiliary substrate 9 is connected to the first substrate S1. To that end, benzocyclobutene is whirled onto at least one of the surfaces to be joined in such a layer thickness that an adequate planarization ensues. For example, the aforementioned Cyclotene 3022 is employed as BCB, this being obtainable in various concentrations as solution in mesitylene. A desired degree of planarization or, respectively, a layer thickness of the BCB layer (connecting layer VS) required therefor can be set via the concentration of the BCB solution. However, it is also possible to whirl a first BCB layer on for the planarization, to remove the solvent by drying, to at least partially polymerize the first BCB layer by heating and to subsequently whirl a further, thin BCB layer on as adhesive layer. However, degrees of planarization of more than 90 percent are already achieved with one layer given said BCB. After a thermal hardening process to be implemented later, the individual BCB layers unite to form a monolithic connecting layer VS. The same is true of a further BCB layer that can be applied to the second surface O2 of the second substrate. After drying and, as warranted, pre-polymerization of the BCB layers, the two substrates S1 and S2 are placed above one another and exactly mated, so that the opening of the via hole comes to lie directly over the first contact region KB1. Adjustment marks can be provided on the substrates for exact adjustment.

Figure 7:
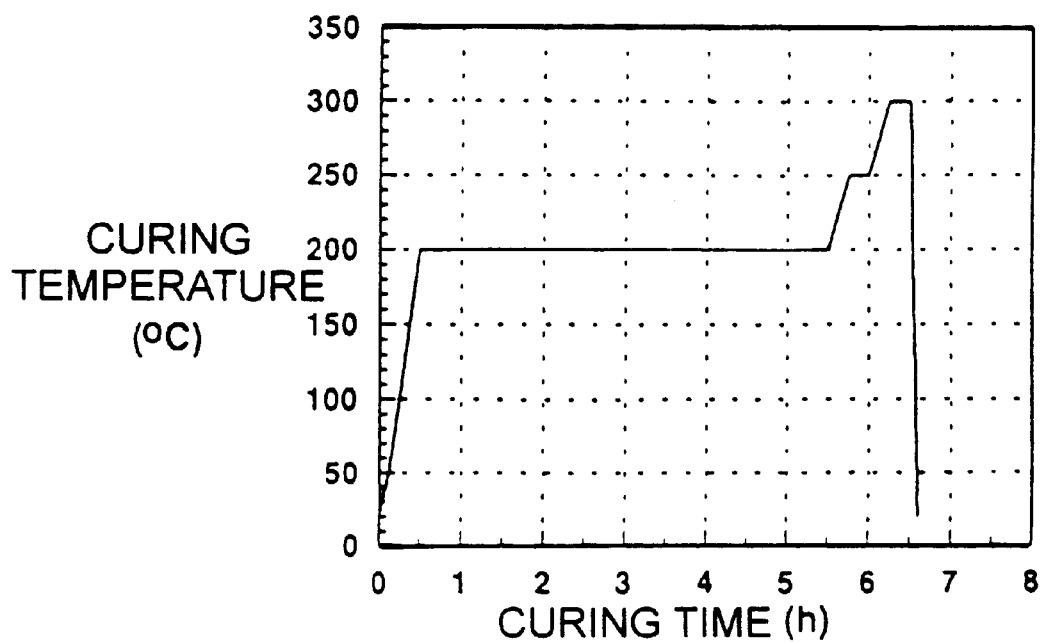
FIG. 7 illustrate a possible temperature program with which the glued connection between first and second substrate can be inventively produced.

After the joining of the two substrates, the BCB layer potentially composed of a plurality of sub-layers is thermally hardened to form the monolithic connecting layer VS. To that end, the arrangement is heated with an optimally low heating rate of, for example, 0.5 through 5° per minute up to a temperature adequate for hardening that usually lies between 180 and 220° C., for example at 200° C. After a holding time of several hours at this temperature, a degree of polymerization of 80 to 98 percent is achieved that already suffices for a stress-free, dimensionally stable connection between the two substrates. For complete hardening, heating is briefly carried out to a higher temperature of 250 through 350° C. This temperature program suitable for curing the BCB layer (EM) is shown in FIG. 7.

Figure 5:
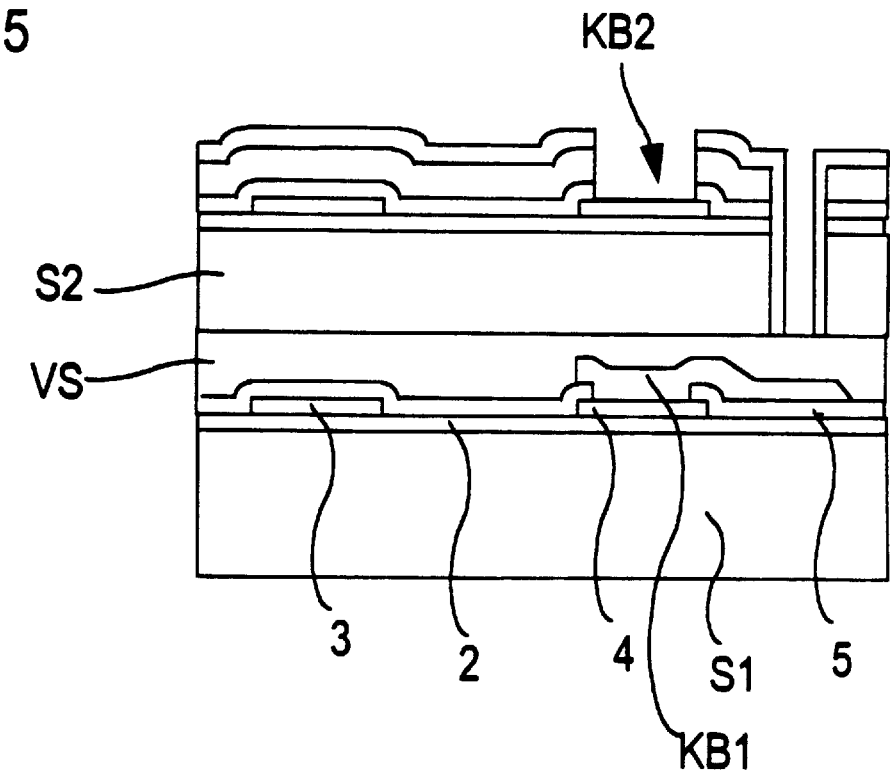
FIGS. 5–6 illustrate two method steps when joining the two substrates in the same manner of presentation.

After the joining of the two substrates with the connecting layer VS, the auxiliary substrate together with the adhesive layer 8 is removed. This can ensues, for example, by etching, plasma incineration or some other dissolution of the adhesive layer. As warranted, the surface is also subsequently cleaned. FIG. 5 shows the arrangement after this procedure.

In the next step, the connecting layer VS is removed through the via hole until the surface of the first contact region KB1 is uncovered in the region of the via hole. A dry-etching process with a plasma containing $CF_4/O_2$ is suitable therefor.

Figure 6:
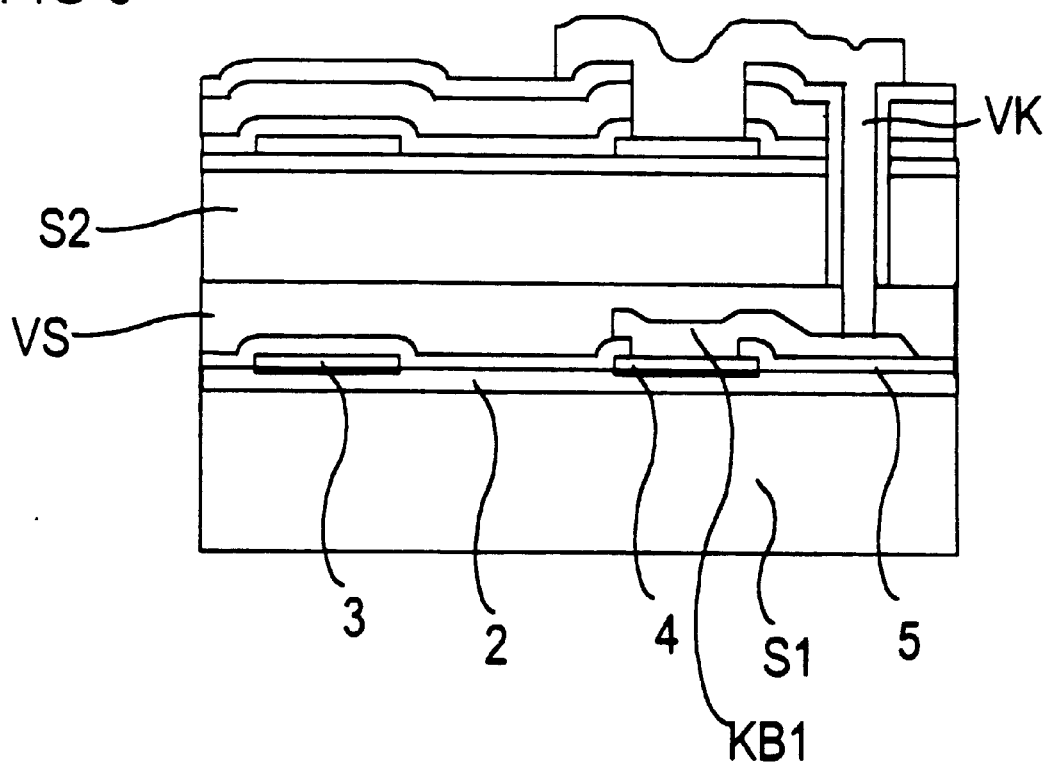

The vertical contact structure VK is generated in the next step in that an adequately electrically conductive contact material that is also suitable for filling the via hole, for example CVD tungsten or tungsten silicide, is applied surface-wide onto the first surface of the second wafer S2. An electrically conductive connection between the first contact region KB1 of the first substrate or, respectively, of the first component level and the contact region KB2 of the second component level is produced in this way. Excess contact material is subsequently removed, for example by being etched off via an etching mask composed, for example, of silicon nitride. FIG. 6 shows the arrangement after this step, whereby a fully functional semiconductor component with two component levels is now already present.

For further enhancement of the integration density, yet another component level can be applied over the semiconductor component and vertically contacted to the component level lying below it, whereby the semiconductor component that was just produced is utilized in the inventive method instead of the first substrate.

In a variation of the inventive method, it is possible to produce the via hole KL only after the joining of the two substrates. In a corresponding modification of the method, the following steps follow: deposition of a passivation layer 7, dry-etching of the passivation layer and of the connecting layer VS in the region of the via hole KL, deposition of a contact material upon production of an electrically conductive connection between first and second contact region, as well as etching back excess contact material. A structure according to FIG. 6 is also obtained with this version.

From the above description, it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

What is claimed is:

1. A semiconductor component comprising:
    a first substrate having an upper surface that is connected to a first component comprising a first contact region that is electrically conductive;
    a second substrate having a thickness of less than 7 μm, the second substrate comprising an upper surface that is connected to a second component comprising a second contact region that is electrically conductive, the second substrate further comprising a lower surface and a via hole extending from the upper surface to the bottom surface thereof;
    a connecting layer sandwiched between the bottom layer of the second substrate and the upper layer of the first substrate, and
    a vertical contact structure that extends from the second contact region, through the via hole in the second substrate and to the first contact region thereby electrically conductively connecting the first contact region and the second contact region,
    the connecting layer comprising a homo-polymerized benzocyclobutene, wherein the homo-polymerized benzocyclobutene comprises monomer units having structures selected from the group consisting of:

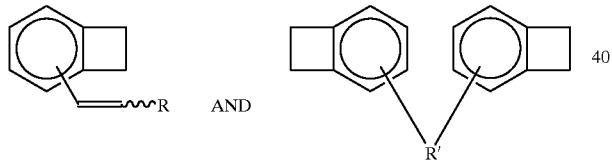

wherein R is selected from the group consisting of an aliphatic radical and an aromatic radical and wherein R' is selected from the group consisting of:

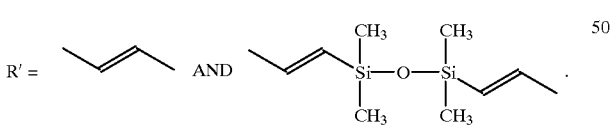

2. The semiconductor component of claim 1 wherein the vertical contact structure comprises a material selected from the group consisting of tungsten, tungsten silicide, tungsten nitride and mixtures thereof.

3. The semiconductor component of claim 1 wherein at least one of the first and second substrates comprises silicon.

4. The semiconductor component of claim 1 wherein the vertical contact structure is pin-shaped.

5. A semiconductor component fabricated by the following steps:
    forming a first component comprising a first contact region on an upper surface of a first substrate;
    forming a second component comprising a second contact region on an upper surface of a second substrate, the second substrate comprising a lower surface, the second substrate having a thickness, the second substrate also comprising a hole extending from the upper surface at least partially through the second substrate towards the lower surface;
    eroding the lower surface of the second surface to reduce the thickness of the second substrate and so that the hole extends from the upper surface to the lower surface;
    circulating a layer of bisbenzocyclobutene between the lower surface of the second substrate and the upper surface of the first substrate, the bisbenzocyclobutene comprising monomer units having structures selected from the group consisting of:

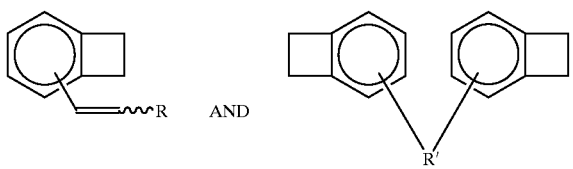

wherein R is selected from the group consisting of an aliphatic radical and an aromatic radical and wherein R' is selected from the group consisting of

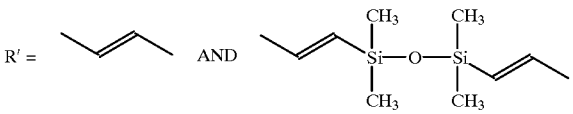

to provide a bisbenzocyclobutene layer;
    drying the bisbenzocyclobutene layer;
    joining the upper layer of the first substrate to the lower layer of the second substrate with the bisbenzocyclobutene layer sandwiched therebetween by initially heating the component at a rate ranging from 0.5–5°/min to a temperature ranging from 180–220° C.;
    holding the component at said temperature until a degree of polymerization of the bisbenzocyclobutene from 80 to 98% is achieved, secondarily heating the component to a temperature of 250 to 350° C. for complete polymerization, and rapidly cooling the component; and
    electrically connecting the first contact region to the second contact region with a vertical contact structure that extends from the second contact region, through the hole and to the first contact region, the vertical contact structure comprises a material selected from the group consisting of tungsten, tungsten silicide, tungsten nitride, and mixtures thereof.

* * * * *